United States Patent [19]

Blackmer

[11] 3,714,462

[45] Jan. 30, 1973

[54] MULTIPLIER CIRCUITS

[76] Inventor: David E. Blackmer, Bolton Road, Harvard, Mass.

[22] Filed: June 14, 1971

[21] Appl. No.: 152,664

[52] U.S. Cl. ....................307/229, 328/145, 328/160

[51] Int. Cl. ....................G06g 7/12

[58] Field of Search ......307/229, 230; 328/145, 160; 235/194

[56] References Cited

UNITED STATES PATENTS

| | | | |
|---|---|---|---|
| 3,532,868 | 10/1970 | Embley | 328/145 X |
| 3,329,836 | 7/1967 | Pearlman et al | 307/229 |

*Primary Examiner*—Herman Karl Saalbach
*Assistant Examiner*—B. P. Davis
*Attorney*—Robert J. Schiller et al.

[57] ABSTRACT

A gain control or multiplier circuit in which an input operational amplifier has a pair of feedback paths through respective collector-emitter circuits of opposite conductivity type transistors to form a first bipolar circuit for converting an input signal to a log form by virtue of the log-linear transfer characteristics of the transistors. Each transistor of the first circuit has connected to it another transistor for converting the log signal into its antilog. A second operational amplifier is used as an output buffer for the resulting combined output signals from the antilog transistors. One version employs a bias circuit connected between the emitters of the first bipolar circuit transistors to adjust quiescent current. Another version uses a neutralization circuit to pump currents into the input summing junctions of both operational amplifiers to adjust for capacitive storage effects. In all cases, a control voltage is summed with the log signal by applying the voltage to the bases of the log and antilog converting transistors, thereby controlling the gain between the two operational amplifiers.

14 Claims, 2 Drawing Figures

PATENTED JAN 30 1973

3,714,462

INVENTOR.
DAVID E. BLACKMER
BY
Schiller & Pandiscio
ATTORNEYS

MULTIPLIER CIRCUITS

This invention relates to electronic multipliers or gain control systems and more particularly to analog multipliers with logarithmic control response.

Many systems, especially those using audio signals, include signal gain circuits controlled in response to an electrical command signal. Many such gain control circuits in use now are variable loss systems using a light dependent resistor or a field effect transistor as an element in a voltage divider. Variable gain transistor stages of many types are also used, the simplest of which varies gain by changing collector current. But this latter device suffers from a d.c. axis shift in response to the control function. Analog multipliers using balanced semiconductor pairs avoid this problem. However, many such analog multipliers have a semiconductor current higher than the peak current to be handled which seriously degrades the low level noise performance.

A principal object of the present invention is to provide an analog multiplier which has excellent gain control over at least a ± 50 decibel range with very low distortion and noise and a constant decibels per volt control characteristic.

Generally the present invention comprises a first bipolar circuit for generating a first signal which is logarithmically related to an input signal, and a second bipolar circuit for establishing the antilogarithms of the first signal. The gain of at least one of the foregoing circuits is variable in accordance with control signals. To effect the foregoing the device includes an input operational amplifier with opposite polarity feedback paths through oppositely conductive respective semiconductor junctions each exhibiting a log-linear transfer characteristic. A second pair of such semiconductor junction are provided, each connected to derive the antilogarithm of the output of a respective junction of the first pair. Because the semiconductors are transistors, the gain across the junctions is preferably controllable in accordance with a control voltage applied to the bases of selected transistors. The term "gain," as used herein, is intended to include both positive gain or expansion and attenuation or diminution.

The term "bipolar" as used herein is intended to mean a device which is capable of operating on an input signal of either or both polarities.

The invention accordingly comprises the apparatus possessing the construction, combination or elements and arrangement of parts which are exemplified in the following detailed disclosure, and the scope of the application of which will be indicated in the claims.

Figure 1:
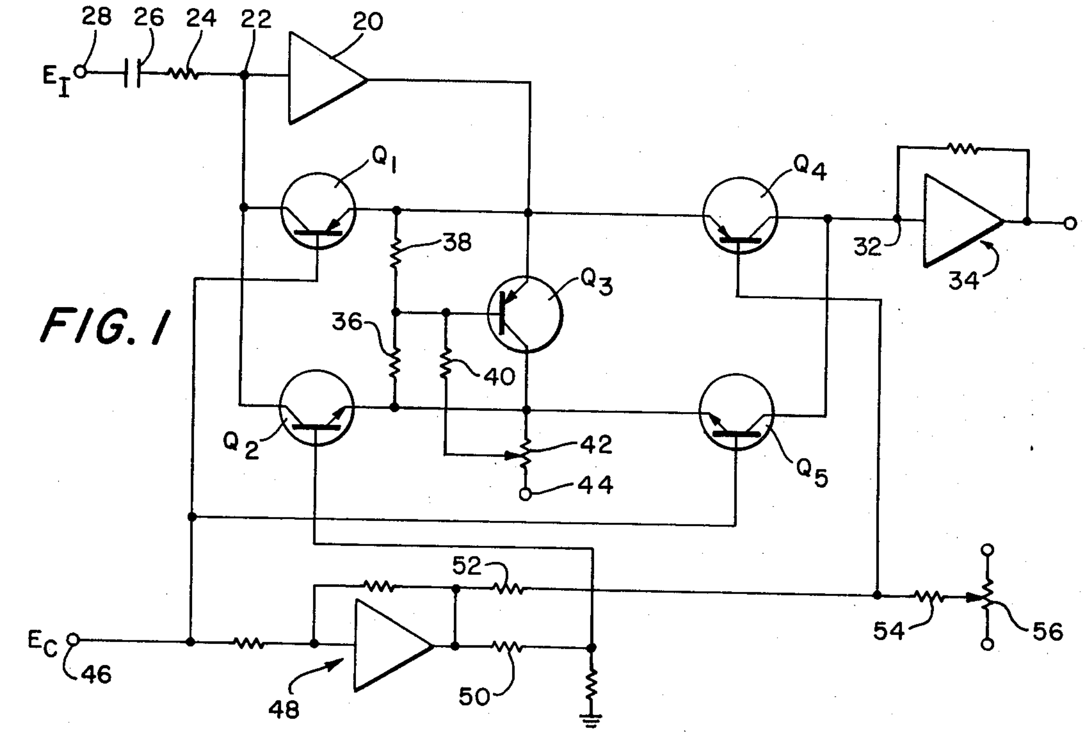
Figure 2:
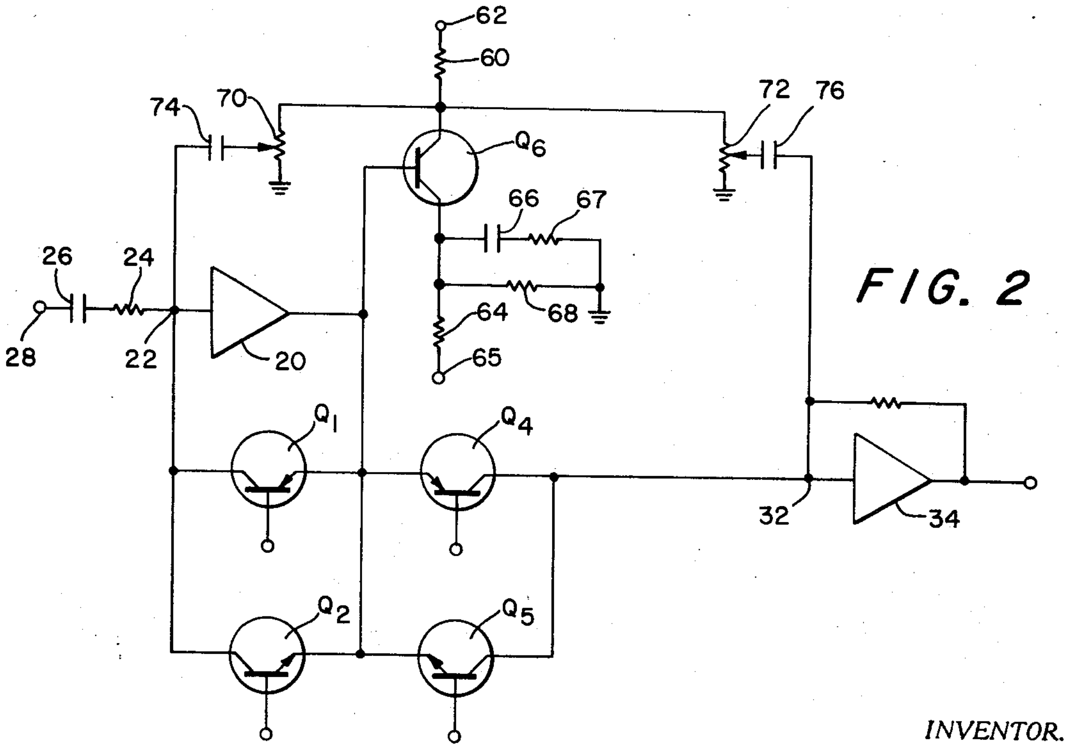

For a fuller understanding of the nature and objects of the invention, references should be had to the following detailed description taken in connection with the accompanying drawings wherein:

FIG. 1 is a circuit schematic showing details of a multiplier embodying the principles of the present invention; and FIG. 2 is a circuit schematic showing the details of an alternative version of the device of FIG. 1.

It is known that, in a number of semiconductor devices having a "diode" junction, the voltage across the junction is a function of the logarithm of the forward current through the junction, i.e., the change in forward current with voltage is exponential. This non-linear behavior of the junction transfer function has been the basis of a number of amplifier circuits having output and input logarithmically related. In the present apparatus, semiconductors with logarithmic transfer functions and exhibiting variable gain transfer characteristics are employed. The latter gain characteristic is preferably substantially linear is decibels per volt.

Referring now to the drawings, there is shown in FIG. 1, apparatus according to the present invention and including an operational amplifier shown generally as including high-gain inverting amplification stage 20 having its input summing junction 22 connected through input resistor 24 and coupling capacitor 26 to first system input terminal 28. Stage 20 is designed preferably to have a very low input bias current and voltage offset. A first semiconductor device or transistor $Q_1$ has its emitter connected to the output of stage 20 and its collector to input junction 22. Transistor $Q_1$ and $Q_2$ are of opposite conductivity types. Another transistor $Q_3$ is connected with its emitter connected to the emitter of transistor $Q_1$ and its collector connected to the emitter of transistor $Q_2$.

Another pair of transistors $Q_4$ and $Q_5$ are included, the former having its emitter connected to the emitter of transistor $Q_1$ and the latter having its emitter connected to the emitter of transistor $Q_2$. The collectors of transistors $Q_4$ and $Q_5$ are connected to one another and to the input summing junction 32 of a second operational amplifier 34.

It will be seen that transistors $Q_1$ and $Q_4$ are both PNP type and are preferably matched for $V_{be}$ within 1 mv at 40$\mu$a. Transistor $Q_2$ and $Q_5$ are NPN type transistors, preferably similarly matched to one another. Because the log-linear transfer characteristic of transistors is a temperature-sensitive function, transistors $Q_1$, $Q_2$, $Q_4$ and $Q_5$ are all preferably tightly thermally linked as by mounting closely adjacent one another on a common heat sink.

The emitters of transistors $Q_1$ and $Q_4$ are connected through a series pair of resistors 36 and 38 to the connected emitters of transistors $Q_2$ and $Q_5$. The output of amplifier stage 20 is connected to the emitter of PNP transistor $Q_3$ and the joined emitters of transistor $Q_1$ and $Q_4$. The base of transistor $Q_3$ is connected to the junction of resistors 36 and 38. The base of transistor $Q_3$ is also connected through resistor 40 to an adjustable tap of potentiometer 42. Potentiometer 42 is connected between the collector of transistor $Q_3$ and an input terminal 44 at which a negative voltage, e.g., −16 V, can be applied. It will be apparent that when the collector-emitter circuit of transistor $Q_3$ is conductive, effectively transistors $Q_1$ and $Q_2$ each constitute an oppositely-poled conductive feedback path around amplifier 20.

A second system input or control terminal 46 is provided, connected to the bases of transistors $Q_1$ and $Q_5$. Also connected to terminal 46 is an inverting operational amplifier 48, the output of which is connected through resistor 50 to the base of transistor $Q_2$ and through resistor 52 to the base of transistor $Q_4$. The base of the latter transistor is also connected through resistor 54 to adjustable potentiometer 56.

In operation, a first signal $E_1$ such as an audio ac is applied at input terminal 28 and a second signal or control voltage is applied to terminal 46 and thus to the bases of transistors $Q_1$ and $Q_5$ directly. The control voltage is also applied in inverted form to the bases of transistors $Q_2$ and $Q_4$, scaled, of course, by resistors 50 and 52. Transistors $Q_1$ and $Q_2$ are connected to provided feedback paths around operational amplifier 20. The latter transistors, being of opposite conductivity types, function as logarithmic converters respectively to convert the positive and negative portions of the input signal to amplifier 20 into logarithmic form. Transistors $Q_4$ and $Q_5$ serve as antilog converters which reconvert the signals from transistors $Q_1$ and $Q_2$ into linear currents.

The signal applied to the bases of transistors $Q_1$ and $Q_5$ and the inverted form of that signal applied to the bases of transistors $Q_2$ and $Q_4$ provides the gain control for the current flowing in the collector-emitter circuits of transistors $Q_1$, $Q_2$, $Q_4$, and $Q_5$. Alternatively, one can simply control the bases of only transistors $Q_1$ and $Q_5$ or the bases of only transistors $Q_2$ and $Q_4$ if extremes in gain (or attenuation) are not required. Essentially, the application of the control voltage to the transistor bases approximates adding the control voltage to the tied emitters of transistors $Q_1$, $Q_2$, $Q_4$ and $Q_5$. This is the equivalent of adding the control signal to the log signal. However, it is preferred to add the signal through the transistor bases, thereby avoiding complicating the circuit with additional amplifiers that would be required to feed directly to the tied emitters.

Resistors 36, 38, 40 and potentiometer 42 permit the crossover region between polarities to be filled and are normally selected to provide a quiescent collector current in transistors $Q_1$, $Q_2$, $Q_4$ and $Q_5$ at a value, typically from 0.1 to 1 a, showing sufficient transistor $f_t$ (gain-bandwidth product) to meet desired frequency response requirements. Specifically, resistors 36 and 38 multiply the temperature coefficient of $V_{be}$ of transistor $Q_3$ to cause the latter, connected collector-emitter across the emitters of transistors $Q_1$ and $Q_2$, to track the sum of the $V_{be}$ temperature coefficients of the latter transistors at their quiescent collector currents. The setting of potentiometer 42 and the value selected for resistor 40 allow the desired value of quiescent current to be set. Similarly the selection of resistor 54 and the setting of potentiometer 56 adjusts for transistor offsets, thereby permitting the gain for negative and positive input signals $E_i$ to be made identical.

If the control voltage $E_c$ at terminal 46 is zero, with balanced transistors the circuit gain will be unity. Typically, $E_c$ will have a control constant of −29.8 mv for + 20 db gain. This constant will have a temperature coefficient of + 0.33%/C° and is proportional to T absolute. A voltage divider having a ratio inversely proportional to T absolute may be used to feed $E_c$ if temperature invarient gain control is desired.

The frequency response of this circuit will be uniform up to well beyond 20 KHz with gains up + 50 decibels and losses to −50 db. Some slight change in frequency response occurs at greater gains. Equivalent input noise voltage with + 40 db gain and 20 KHz noise bandwidth will be about 3.4 microvolts rms which is less than 3 db over the noise due alone to an input resistor of about 22 KΩ. Peak input voltage may be in excess of 100 volts when gain is − 20 db, hence the input signal-to-noise ratio should be greater than 140 decibels. Output signal-to-noise ratio is lower but this presents no significant restriction on audio system performance inasmuch as a gain control device may be expected by the nature of its use to have a lower output dynamic range requirement.

An alternative embodiment wherein like numerals denote like parts, is shown in FIG. 2. In the latter the bias circuit provided by resistors 36, 38 and 40 and potentiometer 42 is eliminated and a neutralization circuit employed instead.

As shown, FIG. 2 includes input terminal 28 coupled through capacitor 26 and resistor 24 to input summing junction 22 of amplifier 20. A pair of opposite conductivity type transistors $Q_1$ and $Q_2$ are each arranged in feedback path between the output of amplifier 20 and summing junction 22. Antilog transistors $Q_4$ and $Q_5$ are coupled to transistors $Q_1$ and $Q_2$ and to one another in the same manner as shown in FIG. 1. For simplicity in exposition, the bases of transistors $Q_1$, $Q_2$, $Q_3$ and $Q_4$ are all shown in FIG. 2 as connected to respective terminals, but it is to be understood that they are to be considered connected as shown in FIG. 1 for control by the signal imposed on terminal 46. The connected collectors of transistors $Q_4$ and $Q_5$ are coupled to summing junction 32 at the input of second operational amplifier 34.

As thus described, the circuit of FIG. 2 is very similar to that of FIG. 1 except that in FIG. 2 the emitters of all four transistors $Q_1$, $Q_2$, $Q_4$ and $Q_5$ are tied together through a direct connection rather than through the collector-emitter circuit of transistor $Q_3$.

To the foregoing circuit of FIG. 2, there is added npn transistor $Q_6$, the base of which is connected to the output of amplifier 20. The collector of transistor $Q_6$ is connected through resistor 60 to terminal 62 at which a supply voltage of one polarity can be applied, e.g., +16 volts. The emitter of transistor $Q_6$ is connected through resistor 64 to another terminal 65 at which the opposite polarity supply voltage, e.g., −16 volts, is to be applied. The emitter is also connected through an RC network of series-connected capacitor 66 and resistor 67 both in parallel with resistor 68, to ground.

The collector of transistor $Q_6$ is connected also to ground through the respective resistors of two potentiometers 70 and 72. The adjustable tap of potentiometer 70 is connected through capacitor 74 to input summing junction 22 of operational amplifier 20; similarly the adjustable tap of potentiometer 72 is connected through capacitor 76 to input summing junction 32 of operational amplifier 34.

Preferably, transistor $Q_6$ is an inverting amplifier with a gain of about 1.5. Capacitor 66 and resistors 67 and 68 are frequency compensating components. In operation, it will be seen that transistor $Q_6$ provides an inversion of the signal from amplifier 20 and a portion of the inverter signal is fed through potentiometers 70 and 72 and their associated capacitors 74 and 76 to the input and output operational amplifier summing points. Potentiometers 70 and 72 should be adjusted so that the currents supplied to the amplifier summing points are equal and opposite to the currents due to the collector-emitter capacitances of transistors $Q_1$, $Q_2$, $Q_4$ and $Q_5$. The circuit thus may provide signals at the emitters of the latter transistors, which signal rapidly slews through the "dead zone" between positive and negative conduction. Distortion due to the charge storage effects in the transistors and to capacitive coupling of the signals from transistor $Q_6$ are thus greatly reduced. For very broadband variable gain circuits one can employ a combination of the neutralization and bias circuits disclosed respectively in FIGS. 2 and 1.

Since certain changes may be made in the above apparatus without departing from the scope of the invention involved, it is intended that all matter contained in the above description or shown in the accompanying drawings shall be interpreted as illustrative and not in a limiting sense.

What is claimed is:

1. An electrical gain control system including
   - a first bipolar circuit for providing first output signal which is logarithmically related to an input signal thereto;
   - means for summing a gain control signal with said first output signal;
   - a second bipolar circuit connected to said first circuit for providing a second output signal which is an anti-logarithmic function of the sum of said first output signal and gain control signal.

2. A system as defined in claim 1 wherein said first circuit comprises a first summing operational amplifier having a pair of negative feedback paths, and a first pair of opposite conductivity type semiconductor devices each disposed to control conduction in a respective one of said feedback paths, each of said devices having a log-linear transfer characteristic.

3. A system as defined in claim 2 wherein said semiconductor devices are transistors having substantially matched $V_{be}$ characteristics and said transistors are mounted on a common heat sink.

4. A system as defined in claim 2 wherein said second circuit comprises a second pair of opposite conductivity type semiconductor devices each connected to the output of a respective one of said first pair of semiconductor devices so as to provide an output signal which is a function of the antilogarithm of the output signals from said first pair of semiconductor devices.

5. A system as defined in claim 4 wherein said semiconductor devices of said second pair are transistor mounted on a common heat sink and have substantially matched $V_{be}$ characteristics.

6. A system as defined in claim 4 wherein all of said semiconductor devices are transistors, each pair having substantially matched $V_{be}$ characteristics, and all are mounted on a common heat sink.

7. A system as defined in claim 1 wherein said means for summing said control signal comprises a control signal terminal connected to control gain of said system for input signals of one polarity and means connected to said terminal for providing an inverted form of said control signal and connected to control gain of said system for input signals of opposite polarity.

8. A system as defined in claim 6 wherein said means for applying said control signal comprises a control signal terminal connected to the base of one transistor of at least one of said pairs, and an inverter having its input connected to said control terminal and its output connected to the base of the other transistor of said one of said pairs.

9. A system as defined in claim 6 wherein said means for applying said control signal comprises a control signal terminal connected to the bases of one transistor of said first pair and one transistor of said second pair, and an inverter having its input connected to said control terminal and its output connected to the bases of the other transistors of said first and second pair.

10. A system as defined in claim 4 including a bias control circuit connected to control quiescent currents in said transistors at a value showing sufficient $f_t$ to meet a desired frequency response of said system.

11. A system as defined in claim 10 wherein said bias control circuit comprises a biasing transistor emitter-collector connected between the emitters of the transistors of said first pair, and a biasing network connected to said biasing transistor so that the latter exhibits a temperature coefficient of $V_{be}$ which matches the sum of the $V_{be}$ temperature coefficients of said transistors of said first and second pairs of their quiescent collector current values.

12. A system as defined in claim 4 including a neutralizing circuit for compensating said system for the total effective collector-emitter capacitances of the semiconductor devices of both said first and second bipolar circuits.

13. A system as defined in claim 12 including second summing operational amplifier havings its input connected to the outputs of said second pair of devices, and wherein said neutralizing circuit comprises an inverter having its input connected to the output of said first operational amplifier and its output coupled to the summing junction inputs of both said first and second operational amplifiers.

14. A system as defined in claim 13 wherein said inverter is a transistor having its base connected to the output of said first operational amplifier and its collector connected through respective series connected potentiometers and capacitors to said summing junction inputs.

* * * * *